(12) United States Patent
Nassau et al.

(10) Patent No.: US 11,688,623 B2
(45) Date of Patent: Jun. 27, 2023

(54) WAFER INSPECTION APPARATUSES (71) Applicant: Samsung Electronics Co., Ltd., Suwon-si (KR)

(72) Inventors: Racine Elysia Auxter Nassau, Yongin-si (KR); Namil Koo, Hwaseong-si (KR); Suhwan Park, Incheon (KR); Taeheung Ahn, Seoul (KR); Sangyeon Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 525 days.

(21) Appl. No.: 16/834,132

(22) Filed: Mar. 30, 2020

(65) Prior Publication Data

US 2021/0057262 A1 Feb. 25, 2021

(30) Foreign Application Priority Data

Aug. 21, 2019 (KR) ........................ 10-2019-0102565

(51) Int. Cl.
*H01L 21/683* (2006.01)
*H01L 21/687* (2006.01)
*G01N 21/95* (2006.01)

(52) U.S. Cl.
CPC ..... *H01L 21/6838* (2013.01); *G01N 21/9501* (2013.01); *H01L 21/68714* (2013.01)

(58) Field of Classification Search
CPC ......... H01L 21/67242–67294; H01L 21/6838; H01L 21/68714; G01N 21/9503–9505; G01N 21/9501

(Continued)

(56) References Cited

U.S. PATENT DOCUMENTS 5,736,745 A * 4/1998 Nagashima ............ G01Q 30/04
250/222.2
6,126,381 A * 10/2000 Bacchi .............. H01L 21/67766
414/754

(Continued)

FOREIGN PATENT DOCUMENTS

JP                4230899 B2      2/2009
KR    10-2011-0055787 A           5/2011

(Continued)

*Primary Examiner* — Charlee J. C. Bennett
(74) *Attorney, Agent, or Firm* — Harness, Dickey & Pierce, P.L.C.

(57) ABSTRACT

A wafer inspection apparatus includes a support structure including a frame and vacuum chucks mounted thereon, each vacuum chuck having a support surface including a vacuum suction portion, the support structure configured to structurally support a wafer on one or more vacuum chucks, the frame defining an opening larger than an area of the wafer. The wafer inspection apparatus includes an electromagnetic wave emitter configured to irradiate an inspection electromagnetic wave to the wafer, a sensor configured to receive the inspection electromagnetic wave from the wafer based on the inspection electromagnetic wave passing through the wafer, and a driver configured to move at least one of the electromagnetic wave emitter or the frame to change an irradiation location of the wafer. Each vacuum chuck is configured to be selectively movable between a first location and a second location in relation to the frame.

15 Claims, 9 Drawing Sheets

(58) Field of Classification Search
USPC ..... 269/21; 118/715–733; 156/345.1–345.55
See application file for complete search history.

(56) References Cited

U.S. PATENT DOCUMENTS

| | | | |
|---|---|---|---|
| 6,439,740 B1* | 8/2002 | Yan | F21S 6/007 |
| | | | 362/147 |
| 7,108,471 B2 | 9/2006 | Osuga | |
| 7,217,934 B2 | 5/2007 | Mori | |
| 10,186,446 B2 | 1/2019 | Weed | |
| 11,029,256 B2* | 6/2021 | Ahn | H01L 21/67288 |
| 2006/0222477 A1* | 10/2006 | Moura | H01L 21/68 |
| | | | 414/217 |
| 2008/0318350 A1* | 12/2008 | Bhatnagar | G01N 21/9501 |
| | | | 356/73 |
| 2009/0014127 A1 | 1/2009 | Shah et al. | |
| 2010/0034621 A1* | 2/2010 | Martin | H01L 21/67265 |
| | | | 414/217.1 |
| 2012/0314212 A1 | 12/2012 | Jang et al. | |
| 2013/0162980 A1 | 6/2013 | Kim et al. | |
| 2015/0014124 A1* | 1/2015 | Tagawa | H01L 21/68707 |
| | | | 198/468.2 |
| 2016/0261786 A1 | 9/2016 | Ahn et al. | |
| 2017/0352627 A1 | 12/2017 | Nakamura | |
| 2018/0284071 A1 | 10/2018 | Wright | |
| 2018/0364181 A1 | 12/2018 | Park et al. | |
| 2019/0033233 A1 | 1/2019 | Amanullah et al. | |
| 2019/0131145 A1 | 5/2019 | Tai et al. | |
| 2019/0148212 A1 | 5/2019 | Lin et al. | |
| 2021/0210365 A1* | 7/2021 | Freimuth | B65G 47/90 |

FOREIGN PATENT DOCUMENTS

| | | |
|---|---|---|
| KR | 10-2012-0105670 A | 9/2012 |
| KR | 10-2013-0072535 A | 7/2013 |
| KR | 10-2016-0080580 A | 7/2016 |
| KR | 10-2016-0107006 A | 9/2016 |
| KR | 10-2019-0049316 A | 5/2019 |
| KR | 10-2019-0049983 A | 5/2019 |
| KR | 10-2019-0051654 A | 5/2019 |

* cited by examiner

WAFER INSPECTION APPARATUSES

CROSS-REFERENCE TO RELATED APPLICATION

This application claims benefit of priority, under 35 U.S.C. § 119, to Korean Patent Application No. 10-2019-0102565 filed on Aug. 21, 2019 in the Korean Intellectual Property Office, the disclosure of which is incorporated herein by reference in its entirety.

BACKGROUND

The present disclosure relates to wafer inspection apparatuses.

In order to manage the quality of semiconductor wafers, an inspection process of the semiconductor wafers is performed during semiconductor wafer manufacturing.

In general, a vacuum chuck is used in a wafer inspection apparatus to hold a semiconductor wafer during inspection of the wafer. Most vacuum chucks apply a vacuum to a rear surface of a wafer to hold the wafer in place. Since a reflective inspection apparatus detects electromagnetic waves reflected from a front surface of a wafer, wafer measurement may not be disturbed even when a vacuum chuck is disposed on a rear surface of the wafer. However, in a transmissive inspection apparatus, electromagnetic waves cannot pass through a wafer region in contact with a vacuum chuck, and thus, there may be an unmeasurable region.

SUMMARY

Some example embodiments provide a wafer inspection apparatus configured to increase in an inspection area of a wafer.

According to some example embodiments, a wafer inspection apparatus may include a support frame, an electromagnetic wave emitter, a sensor, and a driver. The support structure may include a frame, the frame including a plurality of vacuum chucks, each vacuum chuck of the plurality of vacuum chucks being mounted on the frame and each having a support surface including a vacuum suction portion. The support structure may be configured to structurally support a wafer on one or more vacuum chucks of the plurality of vacuum chucks, the frame defining an opening larger than an area of the wafer. The electromagnetic wave emitter may be configured to irradiate an inspection electromagnetic wave to the wafer. The sensor may be configured to receive the inspection electromagnetic wave from the wafer based on the inspection electromagnetic wave passing through the wafer. The driver may be configured to move at least one of the electromagnetic wave emitter or the frame to change an irradiation location of the wafer. Each vacuum chuck of the plurality of vacuum chucks may be configured to be selectively movable between a first location and a second location in relation to the frame.

According to some example embodiments, a wafer inspection apparatus may include a frame defining an opening, the frame configured to structurally support a wafer in the opening, wherein the opening is larger than an area of the wafer. The wafer inspection apparatus may include a plurality of first vacuum chucks and a plurality of second vacuum chucks. Each vacuum chuck of the plurality of first vacuum chucks and the plurality of second vacuum chucks may have a support surface including a vacuum suction portion. The plurality of first vacuum chucks and the plurality of second vacuum chucks may be configured to be movable between a first location of the frame and a second location of the frame. The support surface of each vacuum chuck may be configured to be coplanar with a reference plane for supporting the wafer when the vacuum chuck is at the first location of the frame. The wafer inspection apparatus may include an electromagnetic wave emitter configured to irradiate an inspection electromagnetic wave to a rear surface of the wafer, a sensor on the wafer, the sensor configured to receive the inspection electromagnetic wave from the wafer based on the inspection electromagnetic wave passing through the wafer, a driver configured to move the electromagnetic wave emitter to change an irradiation location on the rear surface of the wafer, and processing circuitry configured to control movements of the driver and the plurality of first and second vacuum chucks. The plurality of first vacuum chucks and the plurality of second vacuum chucks may be configured to be moved to the second location to deviate from a path of the inspection electromagnetic wave between the wafer and the electromagnetic wave emitter. The plurality of first vacuum chucks may be configured to be moved to the first location such that the support surfaces of the plurality of first vacuum chucks are in contact with first contact regions of the rear surface of the wafer, and the plurality of second vacuum chucks may be configured to be moved to the first location such that the support surfaces of the plurality of second vacuum chucks are in contact with second contact regions of the rear surface of the wafer, the first and second contact regions being different regions of the rear surface of the wafer.

According to some example embodiments, a wafer inspection apparatus may include a support structure including a frame. The frame may include a plurality of vacuum chucks. Each vacuum chuck of the plurality of vacuum chucks may be mounted on the frame and each vacuum chuck may have a support surface including a vacuum suction portion. The support structure may be configured to structurally support a wafer on one or more vacuum chucks of the plurality of vacuum chucks. The frame may define an opening larger than an area of the wafer. Each vacuum chuck may be configured to be positioned such that the support surface of the vacuum chuck is coplanar with a reference plane on which the wafer is supported by the support structure. The wafer inspection apparatus may include an electromagnetic wave emitter configured to irradiate an inspection electromagnetic wave to the wafer, a sensor configured to receive the inspection electromagnetic wave from the wafer based on the inspection electromagnetic wave passing through the wafer, and a driver configured to move at least one of the electromagnetic wave emitter or the frame to change an irradiation location of the wafer. Each vacuum chuck of the plurality of vacuum chucks may be configured to be separated from the reference plane to descend along the frame or to be flipped downwardly in relation to the frame.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
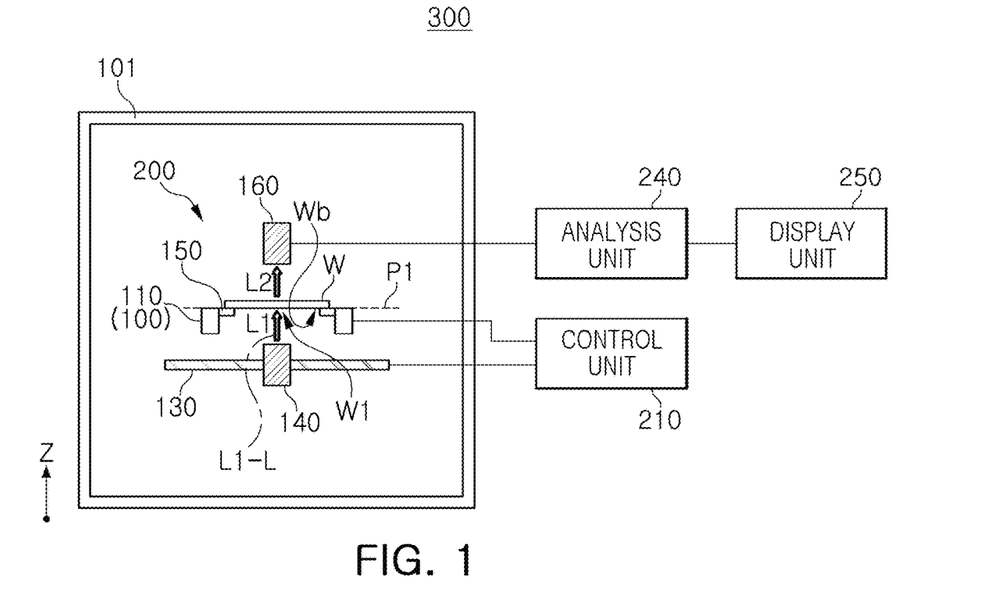
FIG. 1 is a schematic diagram of a transmissive wafer inspection system according to some example embodiments.
Figure 2:
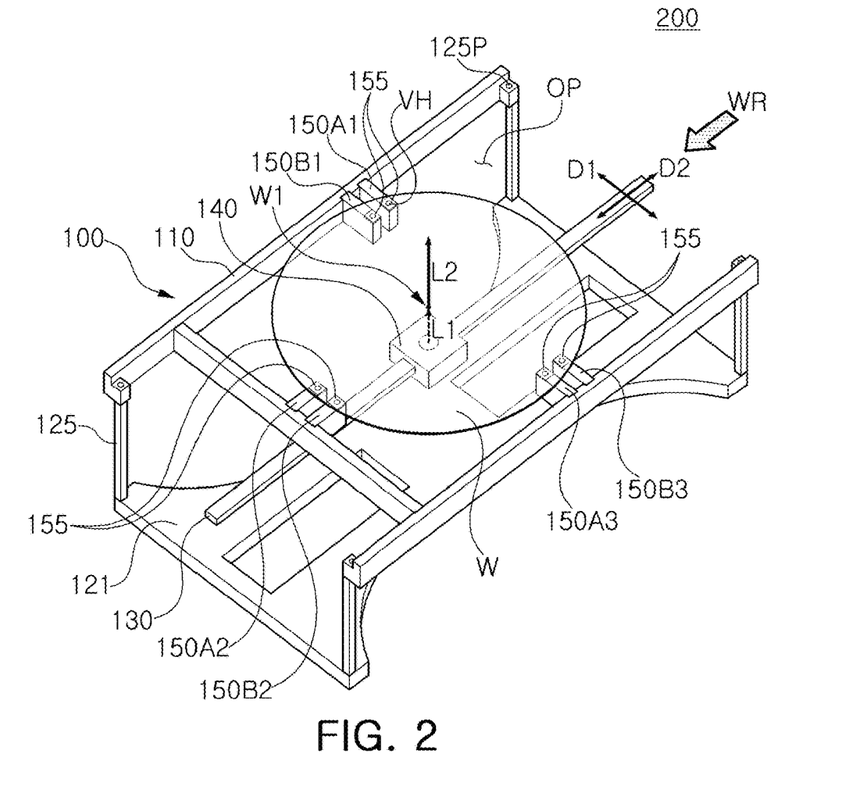
FIG. 2 is a perspective view of a transmissive wafer inspection apparatus according to some example embodiments.

FIG. 1 is a schematic diagram of a transmissive wafer inspection system according to some example embodiments, and FIG. 2 is a perspective view of a transmissive wafer inspection apparatus employable in the system illustrated in FIG. 1.

The wafer inspection system 300, illustrated in FIG. 1, may include a chamber 101 provided with a wafer inspection apparatus 200, a control unit 210 configured to control the wafer inspection apparatus 200, and an analysis unit 240 configured to analyze a result measured by the wafer inspection apparatus 200. The wafer inspection system 300 may further include a display unit 250 connected to the analysis unit 240 to display the measured result and/or the analyzed result. The display unit 250 may be understood to be any display device configured to display an image, including, without limitation, a light emitting diode (LED) display screen.

As illustrated in FIG. 1, the control unit 210 and/or the analysis unit 240 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a processor that may include central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry of control unit 210 and/or analysis unit 240 may include a non-transitory computer readable storage device (e.g., memory), for example a solid state drive (SSD), storing a program of instructions, and a processor coupled to the storage device (e.g., via a bus) and configured to execute the program of instructions to implement the functionality of the control unit 210 and/or the analysis unit 240. Accordingly, a control unit 210 and/or analysis unit 240 as described herein may be interchangeably referred to as "processing circuitry" that may be configured to implement any and all functionality of the control unit 210 and/or analysis unit 240 as described herein.

The wafer inspection apparatus 200 is a transmissive inspection apparatus analyzing characteristics of a wafer W using a manner in which inspection electromagnetic waves pass through the wafer W. In some example embodiments, the wafer inspection apparatus 200 includes a support structure 100 supporting a wafer W (e.g., structurally supporting a weight, or load, of the wafer W), an emission unit 140 (also referred to interchangeably herein as an electromagnetic wave emitter) configured to irradiate one or more inspection electromagnetic waves L1 to the wafer W, and a detection unit 160 (also referred to interchangeably herein as a sensor) on (e.g., over, isolated from direct contact with or in direct contact with) the wafer W and configured to receive (e.g., detect) one or more inspection electromagnetic waves L2 passing through the wafer W. The one or more inspection electromagnetic waves L2 may include at least a portion of the one or more inspection electromagnetic waves L2 irradiated to the wafer W, such that the detection unit 160 may detect an electromagnetic wave L2 from the wafer W based on the inspection electromagnetic wave L2 being irradiated to the wafer W as inspection electromagnetic wave L1 and passing through the wafer W as inspection electromagnetic wave L2.

An inspection electromagnetic wave, used in the wafer inspection apparatus 200, refers to an electromagnetic wave having a magnitude, or the like, varying depending on physical properties of a wafer W, an inspection target, after passing through the wafer W.

FIG. 2 is a perspective view of a wafer inspection apparatus 200 employable in some example embodiments.

As illustrated in FIG. 2, a support structure 100, employed in the wafer inspection apparatus 200, may structurally support a wafer W (e.g., may support the load of the wafer W). The support structure 100 may include a frame 110, defining an opening OP larger than an area of the wafer W, and a plurality of vacuum chucks 150A1, 150A2, and 150A3 and 150B1, 150B2, and 150B3 that are each mounted on a frame 110 to be disposed in the opening OP defined by the frame 110. Each vacuum chuck of the plurality of vacuum chucks 150A1, 150A2, and 150A3 and 150B1, 150B2, and 150B3 may have a support surface 155 provided with (e.g., including) a vacuum suction portion VH, which may be an opening via which a vacuum may be applied. The support structure 100 may structurally support the wafer W on one or more vacuum chucks of the plurality of vacuum chucks 150A1, 150A2, and 150A3 and 150B1, 150B2, and 150B3. For example, the support structure 100 may structurally support the wafer W on some but not all of the vacuum chucks of the plurality of vacuum chucks 150A1, 150A2, and 150A3 and 150B1, 150B2, and 150B3.

In some example embodiments, the support structure 100 may include a base plate 121 and four support members 125 mounted on corners of the base plate 121 to support the frame 110. The frame 110 may be fixed to an upper end of the support members 125 by a fastening means 125P such as a screw or a pin.

The frame 110 may include three sides and may have a rectangular structure in which an open side is open, for example, a [-shaped structure. Restated, the frame 110 may include a rectangular frame, a circular frame, or a [-shaped frame. The wafer W may be loaded and unloaded through the open side of the frame 110 (indicated by "WR"). A shape of the frame 110 is not limited thereto, and the frame 110 may have various shapes such as a rectangle and a circle (see FIGS. 8 and 9).

The vacuum chucks 150A1, 150A2, 150A3, 150B1, 150B2, and 150B3, employed in some example embodiments, may be respectively configured to be movable along the frame 110, and may be divided into at least two groups (e.g., a plurality of groups of vacuum chucks), each group of vacuum chucks including three chucks, (a first group and a second group). Each group of the vacuum chucks 150A1, 150A2, 150A3 and 150B1, 150B2, and 150B3 may be mounted on three sides of the frame 120 to support (e.g., structurally support) the wafer W to be disposed on an opening OP. The opening OP may be defined by the frame 110 and may be configured such that the entire region of the wafer W is exposed to be inspected. In some example embodiments, the movement of the vacuum chucks 150A1, 150A2, 150A3 and 150B1, 150B2, and 150B3 may be performed for each group to increase a wafer inspection area, which will be described later with reference to FIGS. 4 to 7.

Each vacuum chuck of the plurality of vacuum chucks 150A1, 150A2, and 150A3 and 150B1, 150B2, and 150B3 may include a support surface 155 which may be in contact with a rear surface of the wafer W. While a vacuum chuck is in contact with the support surface 155, the inside of the vacuum chuck is brought into a vacuum state or a low-pressure state by a vacuum suction portion VH, such that a vacuum may be applied to a portion of the wafer W via the vacuum suction portion VH to at least partially hold the wafer W in place. Thus, the wafer W may be stably held on the support surface 155 during the wafer inspection process.

Figure 3:
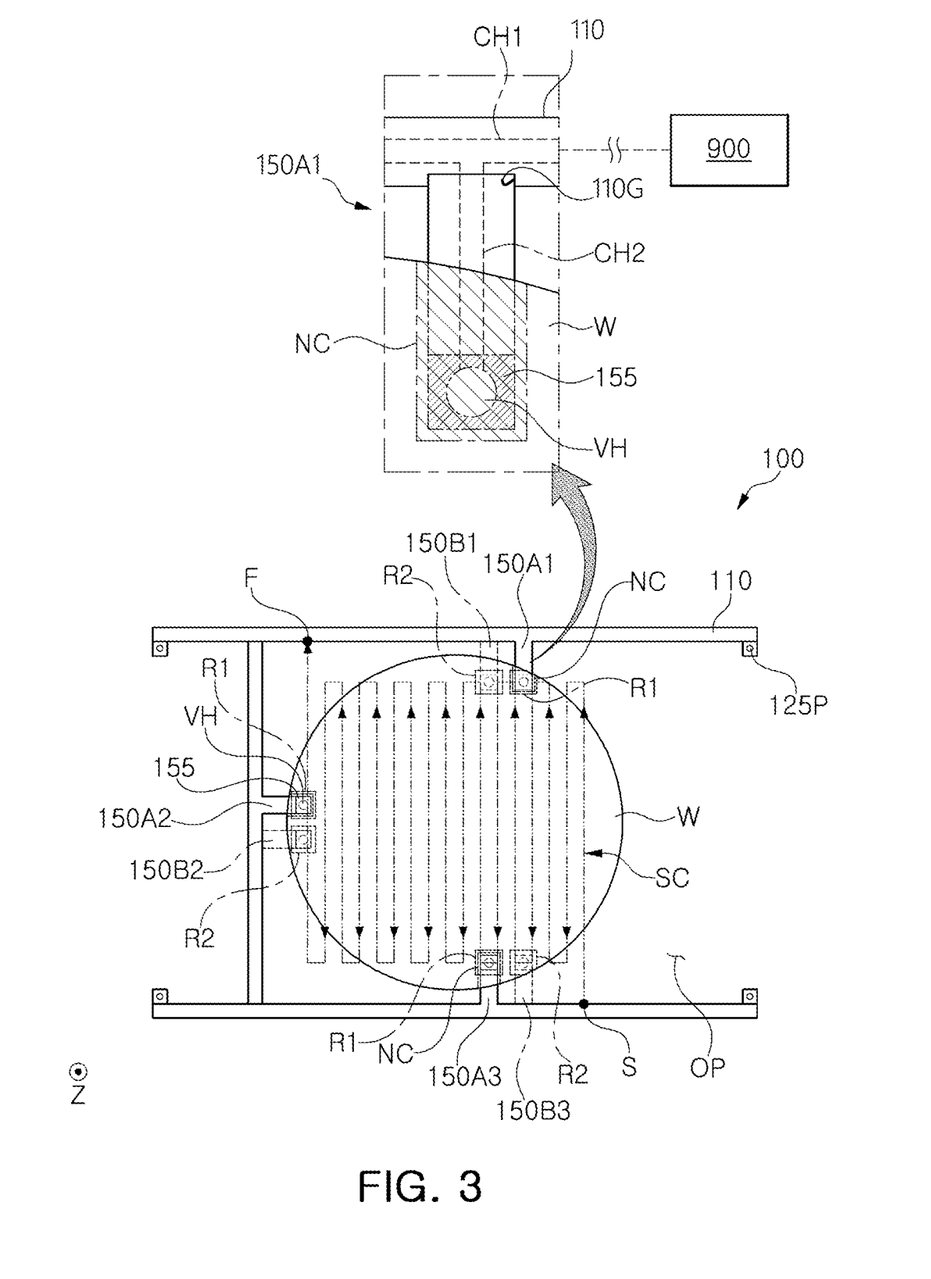
FIG. 3 is a plan view of the transmissive wafer inspection device illustrated in FIG. 2.

As illustrated in FIG. 3, such a vacuum may extend in the frame 110 and may be performed through a first channel CH1, extending into the frame 110 and being in fluid communication with an external vacuum source 900, and a second channel CH2 extending into a vacuum chuck and being in fluid communication with the first channel CH1. The vacuum suction portion VH may be connected to (e.g., in fluid communication with) the second channel CH2 and may be provided to include a concave structure formed on the support surface 155.

In addition, the wafer inspection apparatus 200 may include a moving unit 130 (also referred to herein as a driver) that may move the emission unit 140 to change an irradiation location W1 of the wafer W (e.g., a location W1 on the rear surface Wb of the wafer W to which the inspection electromagnetic wave L1 is irradiated). The moving unit 130 may include, for example, a servo actuator, including a linear servo actuator. In some example embodiments, the moving unit 130 may move the frame in relation to the wafer W in order to change an irradiation location of the wafer W, in alternative to or in addition to moving the emission unit 140. Thus, it will be understood that the moving unit 130 may move at least one of the emission unit 140 or the frame 110 to change an irradiation location W1 of the wafer W to which an inspection electromagnetic wave L1 is irradiated by the emission unit 140.

As illustrated in FIG. 2, the emission unit 140 may be moved (e.g., by the moving unit 130) to a desired inspection location in a first direction D1 and a second direction D2, intersecting the first direction D1, using the moving unit 130. As illustrated in FIG. 3, the entire region (e.g., entire area) of the wafer W may be scanned using the electromagnetic waves L1 through such a movement of the emission unit 140 to analyze transmitted electromagnetic waves (e.g., waves L2 detected at the detection unit 160) to perform a desired wafer (W) inspection. FIG. 3 is a plan view of FIG. 2 and illustrates an example of the above-described scanning process using the electromagnetic waves.

Referring to FIG. 3, wafer inspection may be performed through successive scanning SC from one start point S to an end point F, as indicated by a dotted arrow. However, since electromagnetic waves L1 cannot pass through regions of a wafer W, which are in contact with a plurality of vacuum chucks 150A1, 150A2, 150A3, 150B1, 150B2, and 150B3, due to the vacuum chucks 150A1, 150A2, 150A3, 150B1, 150B2, and 150B3, desired analysis may not be performed.

As described above, a region NC, which cannot be analyzed due to a vacuum chuck, may include not only a region, which is in direct contact with the vacuum chuck, but also a neighboring region in which electromagnetic interference may occur.

In order to address such an issue, the plurality of vacuum chucks 150A1, 150A2, and 150A3 and 150B1, 150B2, and 150B3, employed in some example embodiments, may be configured to be selectively (for example, for each group) movable between a first location and a second location in the frame 110, as described above. Thus, it will be understood that the plurality of vacuum chucks 150A1, 150A2, and 150A3 and 150B1, 150B2, and 150B3, employed in some example embodiments, may be configured to be selectively (for example, for each group) movable between a first location and a second location in relation to the frame 110.

As shown in FIG. 3, the plurality of vacuum chucks may include a first group of vacuum chucks 150A1, 150A2, 150A3 and a second group of vacuum chucks 150B1, 150B2, 150B3, where each group includes three vacuum chucks, and where the first and second groups of vacuum chucks include three pairs of adjacent vacuum chucks 150A1 and 150B1, 150A2 and 150B2, and 150A3 and 150B3 that are adjacent to each other (e.g., a pair of adjacent vacuum chucks 150A1 and 150B1, a pair of adjacent vacuum chucks 150A2 and 150B2, a pair of adjacent vacuum chucks 150A3 and 150B3).

Since a support surface 155 of each of the plurality of vacuum chucks 150A1, 150A2, 150A3, 150B1, 150B2, and 150B3 in the first location is disposed on (e.g., is coplanar with) a surface for supporting the wafer W (hereinafter referred to as "a reference plane P1"), electromagnetic waves, propagating to a contact region with the wafer W, may be blocked. The "reference plane P1" may be a plane that is coplanar with a rear surface Wb of the wafer W when the wafer W is structurally supported by the frame 110, and thus the wafer W may be described as being disposed on and/or supported on the reference plane P1 when the wafer W is supported (e.g., structurally supported) by the support structure 100.

As shown in FIG. 3, the first group of vacuum chucks 150A1, 150A2, and 150A3 are configured to be moved to the first location such that the support surfaces 155 of the plurality of first vacuum chucks 150A1, 150A2, and 150A3 are in contact with first contact regions R1 of the rear surface Wb of the wafer W, and the plurality of second vacuum chucks 150B1, 150B2, and 150B3 are configured to be moved to the first location such that the support surfaces 155 of the plurality of second vacuum chucks 150B1, 150B2, and 150B3 are in contact with second contact regions R2 of the rear surface Wb of the wafer W, where the first and second contact regions R1 and R2 are different regions of the rear surface Wb of the wafer W. As shown in FIG. 3, the first and second contact regions R1 and R2 may be adjacent to each other in pairs on the rear surface Wb of the wafer W.

In some example embodiments, as illustrated in FIG. 2, three points (e.g., first contact regions) of the wafer W, which are in contact with the first group of vacuum chucks 150A1, 150A2, and 150A3, and three points (e.g., second contact regions) of the wafer W, which are in contact with the second group of vacuum chucks 150B1, 150B2, and 150B3, may be arranged to be rotationally symmetrical with respect to a center of the wafer (W). The first group of vacuum chucks 150A1, 150A2, and 150A3 may be disposed adjacent to the second group of vacuum chucks 150B1, 150B2, and 150B3 on each side. As shown, each vacuum chuck of the first group of vacuum chucks 150A1, 150A2, and 150A3 and the second group of vacuum chucks 150B1, 150B2, and 150B3 is configured to be moved to a first location where the support surface of the respective vacuum chuck being disposed on (e.g., coplanar with) a reference plane P1 for supporting the wafer W (e.g., plane P1), such that the support surface 155 of each vacuum chuck is configured to be disposed on (e.g., coplanar with) the reference plane P1 when the vacuum chuck is at the first location.

As described above, the vacuum chucks 150A1, 150A2, and 150A3 and 150B1, 150B2, and 150B3 of each group may be arranged in appropriate locations of the frame 110 to support (e.g., structurally support) the wafers W to be inspected in the first location with balance.

In some example embodiments, the plurality of vacuum chucks 150A1, 150A2, 150A3, 150B1, 150B2, and 150B3 in the second location may be disposed to deviate from (e.g., move further away from) an electromagnetic wave path, also referred to as a path of the inspection electromagnetic wave L1, between the wafer W and the emission unit 140. The vacuum chucks 150A1, 150A2, and 150A3 and 150B1, 150B2, and 150B3 of the respective groups may be moved from the first location to the second location to reopen (e.g., expose) wafer regions, having been in contact with vacuum chucks, to enable emission unit 140 to irradiate an inspection electromagnetic wave L1 to the exposed wafer regions to enable inspection of the wafer regions. Accordingly, in some example embodiments, among the plurality of vacuum chucks 150A1, 150A2, and 150A3 and 150B1, 150B2, and 150B3, a first set of vacuum chucks selectively moved to the first location (e.g., 150A1, 150A2, and 150A3 as shown in FIG. 3) may be disposed such that the support surfaces 155 of the first set of vacuum chuck are coplanar with a plane (e.g., P1) on which the wafer W is disposed, and among the plurality of vacuum chucks 150A1, 150A2, and 150A3 and 150B1, 150B2, and 150B3, a second set of vacuum chucks selectively moved to the second location (e.g., 150B1, 150B2, and 150B3 as shown in FIG. 3) may be disposed such that the support surfaces 155 of the second set of vacuum chucks deviate from the path of the inspection electromagnetic wave L1 between the wafer W and the emission unit 140, for example such that the second set of vacuum chucks do not intersect the path L1-L extending in a vertical direction (e.g., Z-direction) perpendicular to the plane on which the wafer W is disposed and the emission unit 140 when the emission unit 140 is aligned with any portion of the wafer W in the vertical direction (e.g., Z-direction). It will be understood that a surface that is described herein as being coplanar with a plane may be substantially coplanar with the plane, such that the surface is coplanar with the plane within manufacturing and/or material tolerances.

There may be various manners of moving a vacuum chuck between the first and second locations. In some example embodiments, the vacuum chucks 150A1, 150A2, 150A3, 150B1, 150B2, and 150B3 may each be moved in a flip manner so as to be separated from the reference plane P1 to be flipped downwardly in relation to the frame 110. In some example embodiments, the vacuum chucks 150A1, 150A2, 150A3, 150B1, 150B2, and 150B3 may each be moved in a flip manner so as to be separated from the reference plane P1 to descend (e.g., slide downwardly) along the frame 110.

For example, the vacuum chucks 150A1, 150A2, 150A3, 150B1, 150B2, and 150B3 in the first location may be disposed on internal sidewalls of the frame 110 to be parallel to the reference plane P1, and a support surface 155 of a vacuum chuck may face upwardly to be in contact with the wafer W. In some example embodiments, the vacuum chucks 150A1, 150A2, 150A3, 150B1, 150B2, and 150B3 in the second location may be flipped below the reference plane P1 to be separated from the internal sidewalls of the frame 110.

Figure 4A:
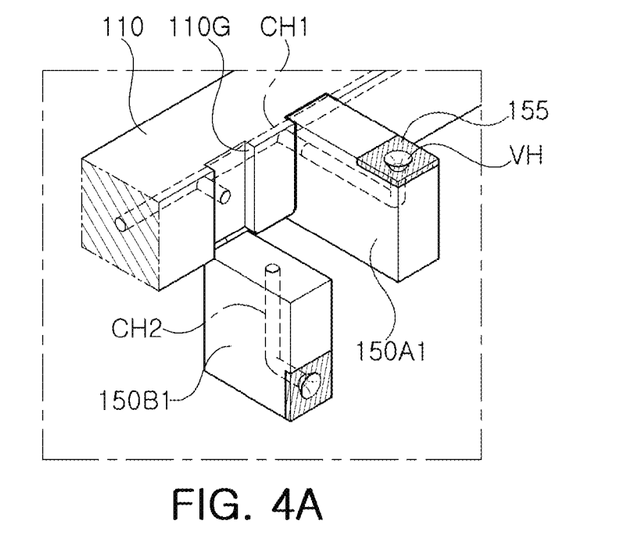
FIGS. 4A and 4B are perspective views illustrating a movement of a vacuum chuck employable in the transmissive wafer inspection apparatus illustrated in FIG. 2.
Figure 4B:
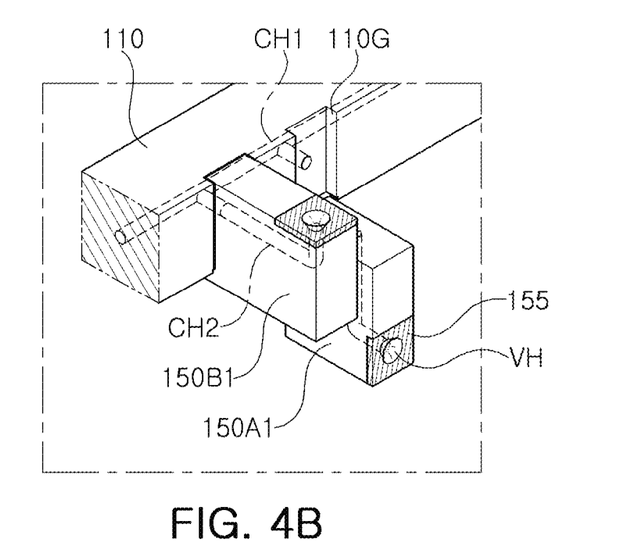

As illustrated in FIGS. 4A and 4B, the plurality of vacuum chucks 150A1, 150A2, 150A3, 150B1, 150B2, and 150B3 may be hingedly connected to a lower end edge of the internal sidewall of the frame 110 and may be configured to be mechanically driven by the control unit 210. Due to the hinge connection, the vacuum chucks 150A1, 150A2, 150A3, 150B1, 150B2, and 150B3 may be moved from the first location to the second location and moved again from the second location to the first location.

Referring to FIG. 4A, the first group of vacuum chucks 150A1, 150A2, and 150A3 may be disposed in the first location, and the second group of vacuum chucks 150B1, 150B2, and 150B3 may flipped to be disposed in the second location.

The first group of vacuum chucks 150A1, 150A2, and 150A3 may be disposed on the internal sidewalls of the frame 110 such that the support surface 155 faces upwardly, and may allow the wafer W to be supported by the support surface 155, as illustrated in FIG. 3. A wafer W, disposed on the support surface 155, may be adsorbed to the support surface 155 through vacuum suction. In some example embodiments, the second group of vacuum chucks 150B1, 150B2, and 150B3 may be flipped vertically downwardly of (e.g., downwardly from) the reference plane P1 to deviate from the reference plane P1. Restated, each vacuum chuck of the second group of vacuum chucks 150B1, 150B2, and 150B3 may, to be selectively moved to the second location from the first location, flipped vertically and downwardly from the first location, as shown in at least FIG. 4A.

Since the first group (e.g., first set) of vacuum chucks 150A1, 150A2, 150A3 may cover a portion (or a support region) of a wafer, they interfere with a path of electromagnetic waves. Meanwhile, the second group of vacuum chucks 150B1, 150B2, and 150B3 do not interfere with a path of electromagnetic waves propagating to the wafer W.

Referring to FIG. 4B, the second group (e.g., second set) of vacuum chucks 150B1, 150B2, and 150B3 may each be moved from a second location to a first location, and the first group of vacuum chucks 150A1, 150A2, and 150A3 may each be flipped in the first location to be disposed in the second location. Restated, each vacuum chuck of the second group of vacuum chucks 150B1, 150B2, and 150B3 may, to be selectively moved to the first location from the second location, flipped vertically and upwardly from the second location, and each vacuum chuck of the first group of vacuum chucks 150A1, 150A2, and 150A3 may, to be selectively moved to the second location from the first location, flipped vertically and downwardly from the first location, as shown in at least FIG. 4B. Accordingly, in view of FIGS. 4A and 4B, it will be understood that each vacuum chuck of the first and second groups of vacuum chucks may be configured to be moved to the second location based on being flipped vertically and downwardly from the reference plane P1.

The second group of vacuum chucks 150B1, 150B2, and 150B3 may disposed on the internal sidewalls of the frame 110 such that the support surface 155 faces upwardly, and may allow the wafer W to be supported by the support surface 155. A wafer W, disposed on the support surface 155, may be adsorbed to the support surface 155 through vacuum suction. In some example embodiments, the first group of vacuum chucks 150A1, 150A2, and 150A3 may be flipped vertically below the reference plane P1 to deviate from the reference plane P1. In FIG. 4A, electromagnetic waves may be radiated to portions of the wafer W, covered with the first group of vacuum chucks 150A1, 150A2, and 150A3.

In some example embodiments, as illustrated in FIGS. 4A and 4B, the internal sidewalls of the frame 110 may have a seating groove 110G corresponding to the vacuum chucks 150A1, 150A2, 150A3, 150B1, 150B2, and 150B3. By assisting in the alignment of the vacuum chucks 150A1, 150A2, 150A3, 150B1, 150B2, and 150B3 when they are moved from the second location to the first location, the seating groove 110G may secure stable connection of a first channel and a second channel. In addition, the vacuum chuck 150A1, 150A2, 150A3, 150B1, 150B2, and 150B3 may be more tightly attached to the seating groove 110G of the frame 110 during a vacuum suction process.

Figure 5:
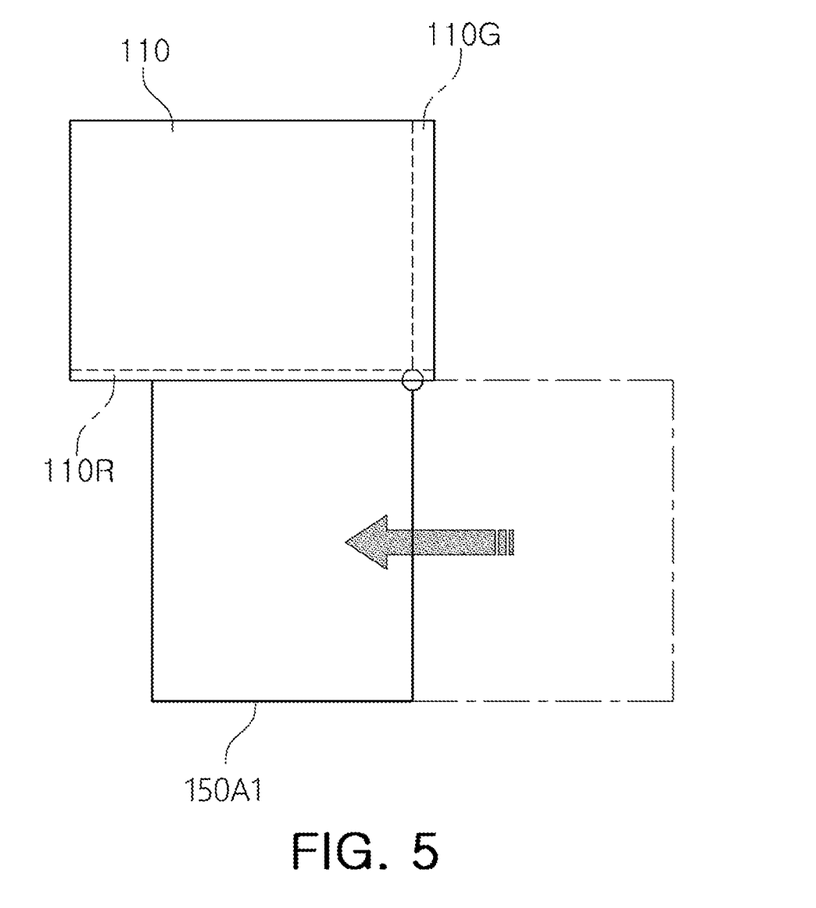
FIG. 5 is a cross-sectional view illustrating an additional movement of the vacuum chuck illustrated in FIG. 4B.

The vacuum chuck 150A1, moving in a flip manner, may further move from the second location to a lower surface of the frame 110 after moving to the second location, as illustrated in FIG. 5. For example, the vacuum chuck 150A1 may move along a rail 110R provided on the lower surface of the frame 110. Due to such a movement, interference of electromagnetic waves may be more effectively avoided than when disposed in the existing second location (indicated by dotted lines).

As described above, the plurality of vacuum chucks 150A1, 150A2, and 150A3 and 150B1, 150B2, and 150B3 may be configured for each group to be movable between the first location and a second location in the frame 110.

While some example embodiments have been described as an example applied to a transmissive wafer inspection apparatus, some example embodiments may also be advantageously used in another manner (for example, a reflective manner), other than the transmissive manner, even when the measurement is disturbed by a vacuum chuck.

Hereinafter, an electromagnetic wave scanning process for wafer inspection and movement of a vacuum chuck for each group will be described.

Figure 6:
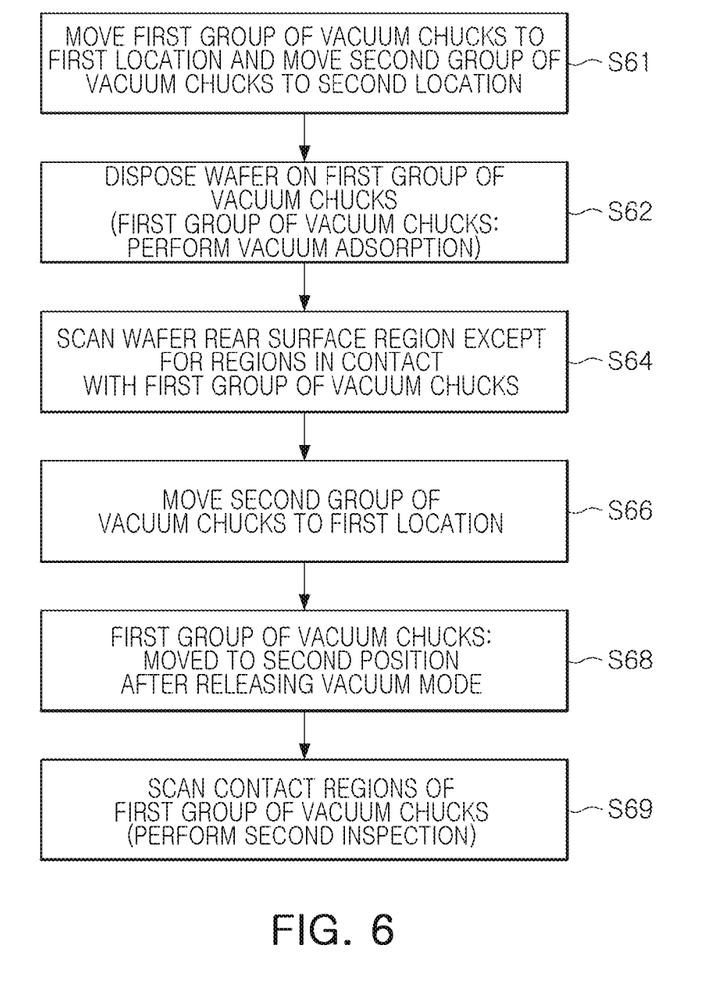
FIG. 6 is a flowchart illustrating a wafer inspection method according to some example embodiments.
Figure 7A:
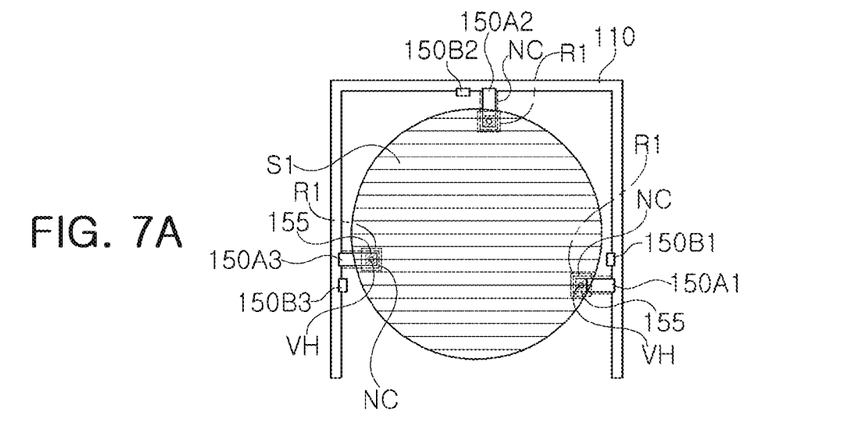
FIGS. 7A, 7B, and 7C are plan views for each inspection process, illustrating a wafer inspection method according to some example embodiments.
Figure 7B:
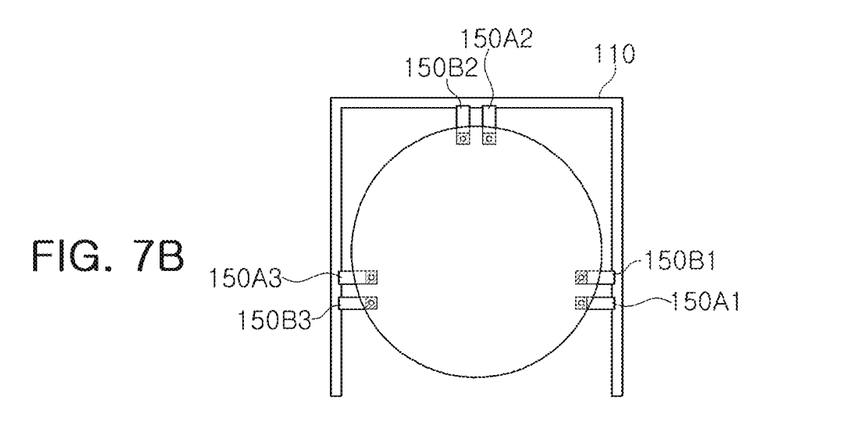
Figure 7C:
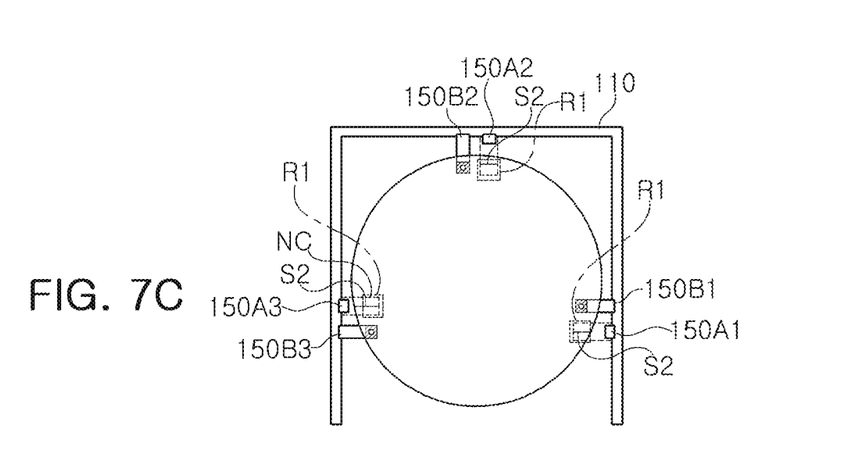

FIG. 6 is a flowchart illustrating a wafer inspection method according to some example embodiments, and FIGS. 7A, 7B, and 7C are plan views for each inspection process, illustrating a wafer inspection method according to some example embodiments.

Referring to FIG. 6, a wafer inspection method according to some example embodiments may start with moving the first group of vacuum chucks 150A1, 150A2, and 150A3 to a first location and moving the second group of vacuum chucks 150B1, 150B2, and 150B3 to a second location (S61).

The first group of vacuum chucks 150A1, 150A2, and 150A3 may be disposed on internal sidewalls of the frame 110 such that a support surface 155 faces upwardly, whereas the second group of vacuum chucks 150B1, 150B2, and 150B3 may be flipped below a reference plane P1 on which a wafer W are to be disposed (see FIGS. 4A and 7A).

In operation S62, the wafer W may be disposed on the first group of vacuum chucks 150A1, 150A2, and 150A3, and vacuum adsorption of the wafer W may be performed through the first group of vacuum chucks 150A1, 150A2, and 150A3.

Support surfaces 155 of the first group of vacuum chucks 150A1, 150A2, and 150A3 may be in contact with regions of a rear surface Wb of the wafer W, respectively. A wafer W, disposed on the support surface 155, may be adsorbed to the support surface 155 through vacuum suction. Electromagnetic waves cannot pass through such contact regions of the wafer W due to the first group of vacuum chucks 150A1, 150A2, and 150A3 (see FIG. 7A).

In operation S64, a first inspection may be performed by scanning the regions of the rear surface Wb of the wafer W, except for contact regions with the first group of vacuum chucks 150A1, 150A2, and 150A3, using electromagnetic waves.

As illustrated in FIG. 7A, first scanning 51 may be performed on regions other than the contact regions with the first group of vacuum chucks 150A1, 150A2, and 150A3 (e.g., first contact regions R1). First unscanned regions may include not only the contact regions with the first group of vacuum chucks 150A1, 150A2, and 150A3 but also a region adjacent to a contact region in which accurate measurement is not ensured due to interference (.

In operation S66, the second group of vacuum chucks 150B1, 150B2, and 150B3 may be moved to the first location, and vacuum suction of the wafer W may be performed through the second group of vacuum chucks 150B1, 150B2, and 150B3.

Thus, the wafer W, on which the first inspection finished to be performed, may be supported by the second group of vacuum chucks 150B1, 150B2, and 150B3 together with the first group of vacuum chucks 150A1, 150A2, and 150A3, as illustrated in FIG. 7B. This process may be introduced as a process for implementing stable replacement of a vacuum chuck while significantly reducing shake of the wafer W. For example, a vacuum chuck for stably supporting the wafer W without shake of the wafer W may be replaced by performing adsorption using the second group of vacuum chucks 150B1, 150B2, and 150B3 while being stably supported by the first group of vacuum chucks 150A1, 150A2, and 150A3.

In operation S68, the first group of vacuum chucks 150A1, 150A2, and 150A3 may be moved to the second location after releasing a vacuum mode of the first group of vacuum chucks 150A1, 150A2, and 150A3.

As described above, since the wafer W is vacuum-adsorbed by the second group of vacuum chucks 150B1, 150B2, and 150B3, the first group of vacuum chucks 150A1, 150A2, and 150A3 may be moved to the second location, as illustrated in FIG. 7C. The first group of vacuum chucks 150A1, 150A2, and 150A3 may be flipped below a reference plane P1 on which the wafer W is to be disposed (e.g., FIG. 4B).

When such a vacuum chuck is moved, for example, such a vacuum is in contact with the wafer W (for example, moved to the first location) and when separated from the wafer (for example, moved to the second location), it may be moved in a non-parallel direction from the wafer W, in detail, a direction perpendicular to a rear surface Wb of the wafer W to prevent contact and/or collision with the wafer W during movement of the vacuum chuck.

In operation S69, a second inspection is performed by additionally scanning wafer regions unscanned in the first scanning (e.g., the first contact regions R1).

The regions, scanned in this scanning process, may include a region, which was in contact with a vacuum chuck of the first chuck (e.g., first contact regions R1), and a region around the region. This may allow an entire region of a wafer W to be inspected.

As described above, the scanning process may be divided while selectively supporting a wafer using a plurality of movable vacuum chucks. Thus, a desired inspection may be performed up to an edge region of the wafer, and yield of devices in the vicinity of the wafer edge may be significantly improved.

The operations S61-S69 may be performed by the wafer inspection apparatus 200 based on the control unit 210 causes the wafer inspection apparatus 200 to perform one or more of said operations. For example, the control unit 210 may cause the wafer inspection apparatus 200 to perform a first process (e.g., at least operation S64), in which the emissions unit 140 and the moving unit 130 collective cause the inspection electromagnetic wave L1 to be irradiated to the rear surface Wb of the wafer W except for at least the first contact regions R1 while the first group of vacuum chucks 150A1, 150A2, and 150A3 are at the first location and the second group of vacuum chucks 150B1, 150B2, and 150B3 are at the second location. In addition, the control unit 210 may cause the wafer inspection apparatus 200 to perform a second process (e.g., at least operation S69), in which the emissions unit 140 and the moving unit 130 collective cause the inspection electromagnetic wave L1 to be irradiated to at least the first contact regions R1 (e.g., all regions of the wafer W not irradiated in the first process while the first group of vacuum chucks 150A1, 150A2, and 150A3 are at the second location and the second group of vacuum chucks 150B1, 150B2, and 150B3 are at the first location. In addition, the control unit 210 may cause the wafer inspection apparatus 200 to further perform a process between the first and second processes (e.g., operation S66) which the wafer inspection apparatus 200 causes the plurality of second vacuum chucks 150B1, 150B2, and 150B3 to structurally support the wafer W together with the plurality of first vacuum chucks 150A1, 150A2, and 150A3 based on stopping irradiation of the inspection electromagnetic wave L1 and moving the plurality of second vacuum chucks 150B1, 150B2, and 150B3 to the first location.

The movement of the vacuum chuck and the vacuum adsorption process and the inspection process (for example, the scanning process), illustrated in FIGS. 6 and 7A to 7C, may be performed by the control unit (210 in FIG. 1). In some example embodiments, the plurality of vacuum chucks are described as being divided into two groups, each including three vacuum chucks, and being selectively moved. However, each of the groups may include a different number of vacuum chucks (for example, four vacuum chucks) or may be randomly selected to be individually moved without being divided into a plurality of groups.

In addition, in some example embodiments, the frame is described as a ⊏-shaped structure having three sides, but may have various shapes such as a square and a circle. As described above, the arrangement of the plurality of vacuum chucks and/or the shape of the frame may be variously changed.

Figure 8:
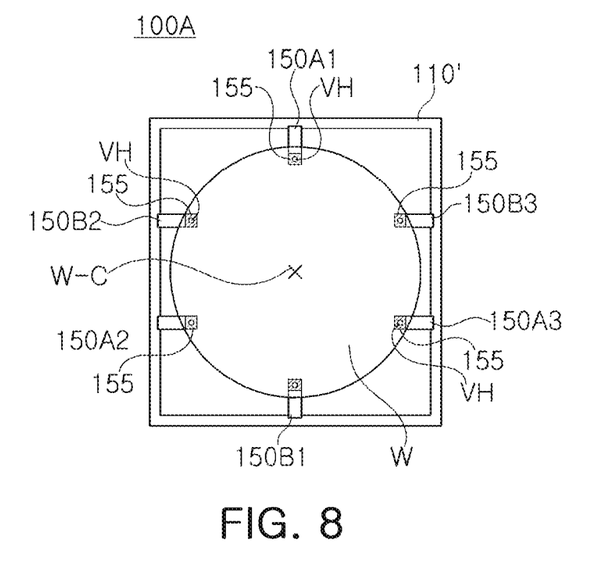
FIGS. 8 and 9 are plan views of transmissive wafer inspection apparatuses according to various example embodiments.
Figure 9:
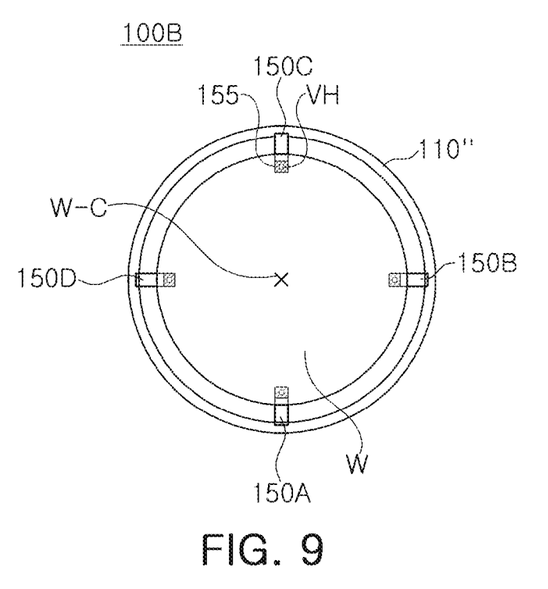

FIGS. 8 and 9 are plan views of wafer inspection apparatuses according to various example embodiments.

Referring to FIG. 8, a wafer inspection apparatus 100A according to some example embodiments may include a frame 110' having a rectangular having four sides.

The plurality of vacuum chucks 150A1, 150A2, 150A3, 150B1, 150B2, and 150B3 may be divided into first and second groups, each having three vacuum chucks. The first group of vacuum chucks 150A1, 150A2, and 150A3 and the second group of vacuum chucks 150B1, 150B2, 150B3 include two pairs of vacuum chucks 150A2, 150A3, 150B2, and 150B3, disposed adjacent to each other (e.g., two pairs of adjacent vacuum chucks 150A2, 150A3, 150B2, and 150B3), and a pair of vacuum chucks 150A1 and 150B1 disposed to face each other (e.g., a pair of opposing vacuum chucks 150A1 and 150B1). As illustrated in FIG. 8, the two pairs of vacuum chucks 150A2, 150A3, 150B2, and 150B3, adjacent to each other, may be respectively disposed on two opposing sides, and the pair of vacuum chucks 150A1 and 150B1 may be disposed on two other opposing sides.

The first and second groups of the vacuum chucks 150A1, 150A2, and 150A3 and 150B1, 150B2, and 150B3 may be disposed to be rotationally symmetrical about a central axis of the wafer W. In some example embodiments, the first group of vacuum chucks 150A1, 150A2, and 150A3 may be disposed such that contact points (or first contact regions R1) of the wafer W form a substantially equilateral triangle, and the second group of vacuum chucks 150B1, 150B2, and 150B3 may be disposed such that contact point (or second contact regions R1) of the wafer W form a substantially inverted triangle, rotationally symmetrical by 180 degrees with respect to the disposition of the equilateral triangle of the first group of vacuum chucks 150A1, 150A2, and 150A3. Thus, the first and second contact regions R1 and R2 may be rotationally symmetrical about a central axis W-C of the wafer W.

The disposition of the vacuum chucks, illustrated in FIG. 8, may be implemented in a frame having another shape such as a circle. In addition, although vacuum chucks do not necessarily constitute a group, an entire wafer area may be inspected in the same method as the wafer inspection method described with reference to FIG. 6.

Referring to FIG. 9, a wafer inspection apparatus 100B according to some example embodiments may include a circular frame 110" and a plurality of vacuum chucks 150A, 150B, 150C, and 150D disposed on the frame 110".

A plurality of vacuum chucks are not basically divided into two groups, and may be randomly combined to replace the selective support by the group described in some example embodiments.

For example, the wafer W is supported by first to third vacuum chucks 150A, 150B, and 150C (a first combination) disposed in a first location, and a first inspection is performed on a wafer region, except for regions in contact with the first to third vacuum chucks 150A, 150B, and 150C, while the wafer is supported by the first combination. Then, the wafer W is supported by first, second, and fourth vacuum chucks 150A, 150B, and 150D (a second combination) disposed in the first location, and a second inspection is additionally performed on a region in contact with the vacuum chuck 150C while the wafer W is supported by the second combination.

In a similar manner, third and fourth inspections may be performed on regions in contact with the first and second vacuum chucks 150A and 150B while the wafer W is supported by the other three vacuum chucks. Thus, the inspection may be performed on the entire area of the wafer W.

Setting of the first and second locations and movement of the first and second locations may be implemented in various forms. In some example embodiments, the vacuum chuck is illustrated as being moved in a flip manner. However, the vacuum chuck may be configured to be moved to the second location, for example, a region not overlapping (e.g., exposed by) a wafer W (for example, a corner region) along a track formed in a frame.

Figure 10A:
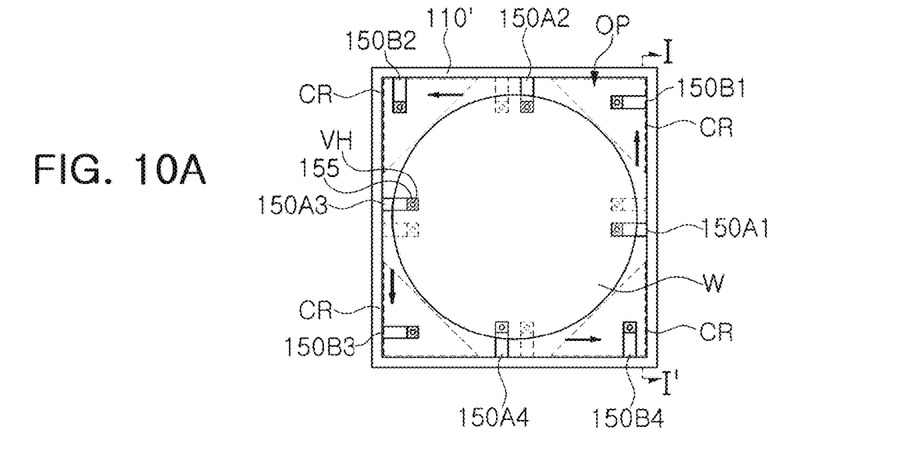
FIGS. 10A, 10B, and 10C are plan views of a wafer inspection apparatus according to some example embodiments.
Figure 10B:
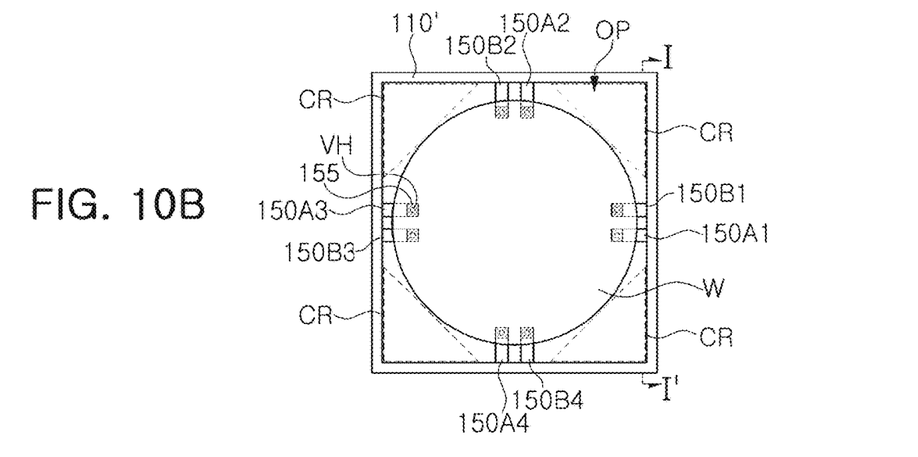
Figure 10C:
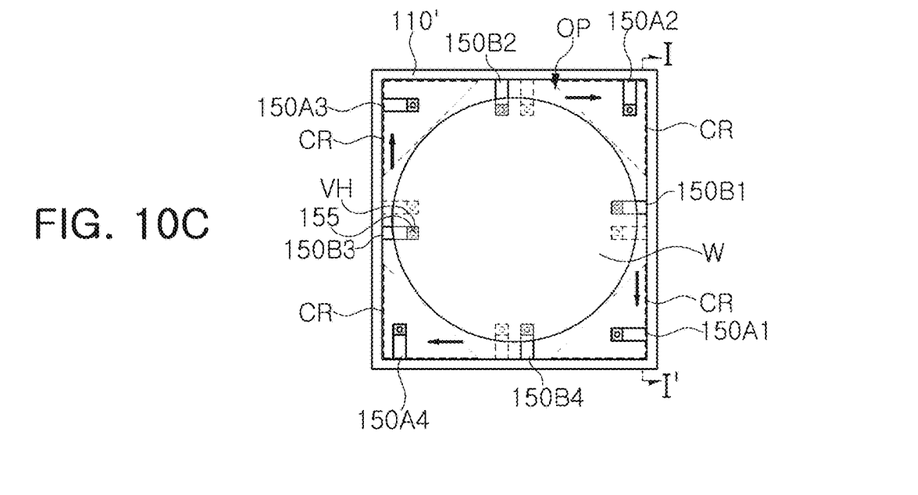
Figure 11A:
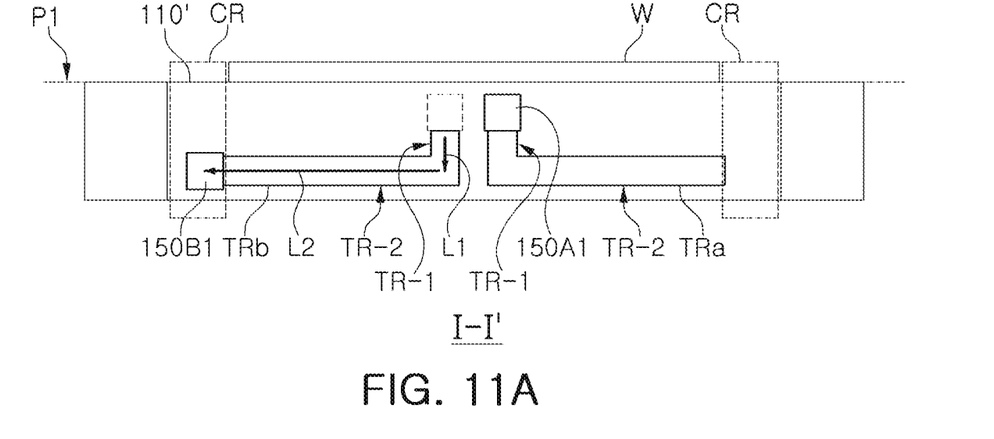
FIGS. 11A, 11B, and 11C are cross-sectional views illustrating movements of a vacuum chuck of the wafer inspection apparatus illustrated in FIGS. 10A, 10B, and 10C, respectively.
Figure 11B:
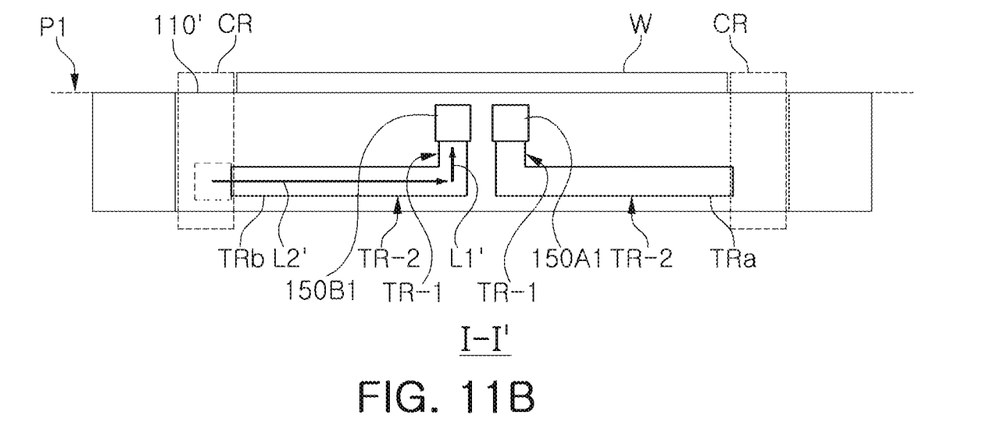
Figure 11C:
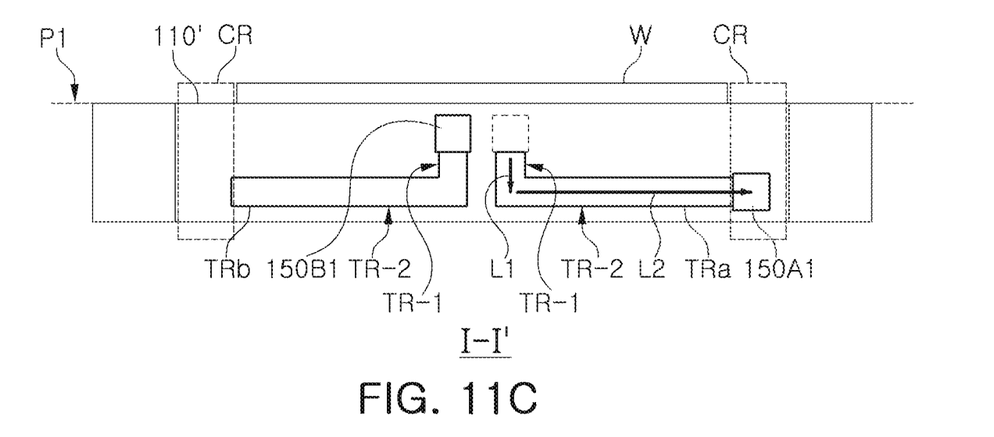

FIGS. 10A, 10B, and 10C are plan views of a wafer inspection apparatus according to some example embodiments, and FIGS. 11A, 11B, and 11C are cross-sectional views illustrating movements of a vacuum chuck of the wafer inspection apparatus illustrated in FIGS. 10A, 10B, and 10C, respectively.

Referring to FIGS. 10A and 11A, a wafer inspection apparatus according to some example embodiments includes a frame 110' having a rectangular shape and a plurality of vacuum chucks 150A1, 150A2, 150A3, 150A4, 150B1, 150B2, 150B3, and 150B4 disposed on the frame 110'. As shown, the frame 110' defines an opening OP that includes multiple corner regions CR that are not covered with the wafer W that is supported by the frame 110', and which may be referred to as corner regions of the opening OP that are exposed by the wafer W supported by the frame 110'. Restated, when the frame 110' supports a wafer W, the frame 110' and the wafer W may collectively define corner regions CR that are exposed between the frame 110' and the wafer W.

As illustrated in FIG. 10A, the plurality of vacuum chucks 150A1, 150A2, 150A3, 150A4, 150B1, 150B2, 150B3, and 150B4 are divided into first and second groups by four. A first group of vacuum chucks 150A1, 150A2, 150A3, and 150A4 may be disposed on four sides, respectively. A second group of vacuum chucks 150B1, 150B2, 150B3, and 150B4 may also be disposed on four sides, respectively. The first group of vacuum chucks 150A1, 150A2, 150A3, 150A4 support a wafer W in a location adjacent to the center of each side (a first location), while the second group of vacuum chucks 150B1, 150B2, 150B3 150B4 may be disposed so as not to overlap the wafer W in one or more adjacent corner regions CR on each side (a second location).

Vacuum chucks, employed in some example embodiments, may be moved along the track TRb provided in the frame 110', as illustrated in FIG. 11A. The second group of vacuum chucks 150B1, 150B2, 150B3, and 150B4 may be moved from the first location to the second location along the track TRb. As shown in FIGS. 11A-11C, each track of the plurality of tracks TRa and TRb includes a first portion TR-1 extending downwardly from the first location, and a second portion TR-2 connected to a lower end of the first portion TR-1 and extending to the second location in a horizontal direction. The movement of the second group of vacuum chucks 150B1, 150B2, 150B3, and 150B4 along the track TRb may include a vertical movement L1, in which they are separated from the wafer W in a substantially perpendicular direction, and a horizontal movement L2 in which they are moved to the second direction in a horizontal direction. Thus, the second group of vacuum chucks 150B1, 150B2, 150B3, and 150B4 may be prevented from contacting and/or colliding against the wafer W during the movement to the second location.

As illustrated in FIGS. 10B and 11B, the second group of vacuum chucks 150B1, 150B2, 150B3 and 150B4 may be moved to the first location along the track TRb provided in the frame 110'. Similarly to the operation S64 of FIG. 6, this movement may be performed after inspecting a wafer region except for regions in contact with the first group of vacuum chucks 150A1, 150A2, 150A3, and 150A4. The second group of vacuum chucks 150B1, 150B2, 150B3 and 150B4 may be moved from the second location to the first location along the track TRb. The movement of the second group of vacuum chucks 150B1, 150B2, 150B3, and 150B4 along this track TRb may include a reserve horizontal movement L2', in which they are moved from the second location in a horizontal direction, and a reverse vertical movement L1' in which they are moved to the first location in a substantially vertical direction. After this movement, similarly to the operation S66 of FIG. 6, the wafer may be vacuum-adsorbed by the second group of vacuum chucks 150B1, 150B2, 150B3, and 150B4 to be supported by the second group of vacuum chucks 150B1, 150B2, 150B3, and 150B4 together with the first group of vacuum chucks 150A1, 150A2, 150A3, and 150A4.

As illustrated in FIGS. 10C and 11C, the first group of vacuum chucks 150A1, 150A2, 150A3, and 150A4 may be moved to a second location along a track TRa provided in the frame 110'. This movement may be performed by an operation similar to the operation S68 of FIG. 6. Specifically, the first group of vacuum chucks 150A1, 150A2, 150A3, and 150A4 may be moved from the first location to the second location along the track TRa after vacuum suction is released. The movement of the first group of vacuum chucks 150A1, 150A2, 150A3, and 150A4 along this track TRa may include a vertical movement L1, in which they are separated from the wafer W in a substantially vertical direction, and a horizontal movement L2 in which they are moved to the second location in the horizontal direction. Thus, the first group of vacuum chucks 150A1, 150A2, 150A3, and 150A4 may be prevented from contacting and/or colliding against the wafer W during the movement to the second location. It will be understood that the second location of the first group of vacuum chucks 150A1, 150A2, 150A3, and 150A4 as shown in FIGS. 10C and 11C, and the second location of the second group of vacuum chucks 150B1, 150B2, 150B3, and 150B4 as shown in FIGS. 10A and 11A, may be in one or more corner regions CR defined between the wafer W and the frame 110'. As further shown in FIGS. 10A-11C, the frame 110' may include a plurality of tracks TRa and TRb configured to enable the plurality of vacuum chucks to be moveable between the first and second locations.

As shown in FIGS. 10A-11C, the plurality of first vacuum chucks 150A1, 150A2, 150A3, 150A4 and the plurality of second vacuum chucks 150B1, 150B2, 150B3, 150B4, in the first location, are adjacent to each other in pairs, and each pair of vacuum chucks, of the plurality of first vacuum chucks 150A1, 150A2, 150A3, 150A4 and the plurality of second vacuum chucks 150B1, 150B2, 150B3, 150B4, in the second location, are disposed in a direction away from the first location, and the frame 110' may include tracks TRa, TRb configured to enable the plurality of vacuum chucks to be movable between the first location and the second location. As shown in FIGS. 10A-11C, the plurality of first vacuum chucks 150A1, 150A2, 150A3, 150A4 and the plurality of second vacuum chucks 150B1, 150B2, 150B3, 150B4, when moved to the second location, are in one or more corner regions CR of the plurality of corner regions CR.

As in some example embodiments, a movement of a vacuum chuck using a track may be similarly applied to a frame having a different shape and a vacuum chuck having a different disposition. For example, a vacuum chuck may be moved to a second location (for example, a corner region CR), not overlapping a wafer W, in the support structure illustrated in FIG. 3 in a manner using a track rather than a flip manner. Additionally, in example embodiments, a movement of a vacuum chuck may be performed by combining the manner using a track with the flip manner. For example, referring to FIG. 5, the vacuum chucks may each be configured to be at least partially horizontally moved through a rail or a track provided along a corner of the frame while being flipped, without moving to a lower surface of the frame.

As described above, according to example embodiments, a vacuum chuck may be configured to be movable. Thus, even a portion, covered with the vacuum chuck, may be measured by an additional inspection process. In particular, example embodiments may be advantageously used in a transmissive wafer inspection apparatus.

While some example embodiments have been shown and described above, it will be apparent to those skilled in the art that modifications and variations could be made without departing from the scope of the present inventive concepts as defined by the appended claims.

What is claimed is:

1. A wafer inspection apparatus, comprising:
a support structure including a frame, the frame including a plurality of vacuum chucks, each vacuum chuck of the plurality of vacuum chucks being mounted on the frame and each having a support surface including a vacuum suction portion, the support structure configured to structurally support a wafer on one or more vacuum chucks of the plurality of vacuum chucks, the frame defining an opening larger than an area of the wafer;
an electromagnetic wave emitter configured to irradiate an inspection electromagnetic wave to the wafer;
a sensor configured to receive the inspection electromagnetic wave from the wafer based on the inspection electromagnetic wave passing through the wafer; and
a driver configured to move at least one of the electromagnetic wave emitter or the frame to change an irradiation location of the wafer,
wherein each vacuum chuck of the plurality of vacuum chucks is configured to be selectively movable between a first location and a second location in relation to the frame,
wherein, among the plurality of vacuum chucks, a first set of vacuum chucks selectively moved to the first location are disposed such that the support surfaces of the first set of vacuum chucks are coplanar with a plane on which the wafer is disposed,
wherein, among the plurality of vacuum chucks, a second set of vacuum chucks selectively moved to the second location are disposed to deviate from a path of the inspection electromagnetic wave between the wafer and the electromagnetic wave emitter, and
wherein each vacuum chuck of the second set of vacuum chucks selectively moved to the second location is flipped vertically and downwardly from the first location.

2. The wafer inspection apparatus of claim 1, wherein the plurality of vacuum chucks include a plurality of groups of vacuum chucks, each group of vacuum chucks including three or more vacuum chucks configured to structurally support the wafer.

3. The wafer inspection apparatus of claim 2, wherein
the plurality of vacuum chucks include first and second groups of vacuum chucks, each group of vacuum chucks including three vacuum chucks, and
the first and second groups of vacuum chucks include three pairs of adjacent vacuum chucks.

4. The wafer inspection apparatus of claim 2, wherein
the plurality of vacuum chucks include first and second groups of vacuum chucks, each group of vacuum chucks including three vacuum chucks, and
the first and second groups of vacuum chucks include two pairs of adjacent vacuum chucks, and
a pair of opposing vacuum chucks facing each other.

5. The wafer inspection apparatus of claim 1, wherein each vacuum chuck of the second set of vacuum chucks selectively moved to the second location is configured to be additionally movable from the second location to a lower surface of the frame.

6. A wafer inspection apparatus, comprising:
a frame defining an opening, the frame configured to structurally support a wafer in the opening, wherein the opening is larger than an area of the wafer;
a plurality of first vacuum chucks and a plurality of second vacuum chucks, each vacuum chuck of the plurality of first vacuum chucks and the plurality of second vacuum chucks having a support surface including a vacuum suction portion, the plurality of first vacuum chucks and the plurality of second vacuum chucks being configured to be movable between a first location of the frame and a second location of the frame, the support surface of each vacuum chuck being configured to be coplanar with a reference plane for supporting the wafer when the vacuum chuck is at the first location of the frame;
an electromagnetic wave emitter configured to irradiate an inspection electromagnetic wave to a rear surface of the wafer;
a sensor on the wafer, the sensor configured to receive the inspection electromagnetic wave from the wafer based on the inspection electromagnetic wave passing through the wafer;
a driver configured to move the electromagnetic wave emitter to change an irradiation location on the rear surface of the wafer; and
processing circuitry configured to control movements of the driver and the plurality of first and second vacuum chucks,
wherein the plurality of first vacuum chucks and the plurality of second vacuum chucks are configured to be moved to the second location to deviate from a path of the inspection electromagnetic wave between the wafer and the electromagnetic wave emitter,
wherein the plurality of first vacuum chucks are configured to be moved to the first location such that the support surfaces of the plurality of first vacuum chucks are in contact with first contact regions of the rear surface of the wafer, and the plurality of second vacuum chucks are configured to be moved to the first location such that the support surfaces of the plurality of second vacuum chucks are in contact with second contact regions of the rear surface of the wafer, the first and second contact regions being different regions of the rear surface of the wafer,
wherein the processing circuitry is configured to cause the wafer inspection apparatus to perform
a first process, in which the electromagnetic wave emitter and driver collectively cause the inspection electromagnetic wave to be irradiated to the rear surface of the wafer except for the first contact regions while the plurality of first vacuum chucks are at the first location and the plurality of second vacuum chucks are at the second location, and
a second process, in which the electromagnetic wave emitter and driver collectively cause the inspection electromagnetic wave to be irradiated to the first contact regions of the rear surface of the wafer while the plurality of first vacuum chucks are at the second location and the plurality of second vacuum chucks are at the first location.

7. The wafer inspection apparatus of claim 6, wherein the processing circuitry is configured to cause the wafer inspection apparatus to further perform a process, between the first and second processes, in which the wafer inspection apparatus causes the plurality of second vacuum chucks to structurally support the wafer together with the plurality of first vacuum chucks based on stopping irradiation of the inspection electromagnetic wave and moving the plurality of second vacuum chucks to the first location.

8. The wafer inspection apparatus of claim 6, wherein the first contact regions and the second contact regions are disposed to be rotationally symmetrical about a central axis of the wafer.

9. The wafer inspection apparatus of claim 6, wherein the first contact regions and the second contact regions are adjacent to each other in pairs on the rear surface of the wafer.

10. The wafer inspection apparatus of claim 6, wherein each vacuum chuck of the plurality of first vacuum chucks and the plurality of second vacuum chucks is configured to be moved to the second location based on being flipped vertically and downwardly from the reference plane.

11. The wafer inspection apparatus of claim 6, wherein
the plurality of first vacuum chucks and the plurality of second vacuum chucks, in the first location, are adjacent to each other in pairs, and
each pair of vacuum chucks, of the plurality of first vacuum chucks and the plurality of second vacuum chucks, in the second location, are disposed in a direction away from the first location, and
the frame includes a plurality of tracks configured to enable the plurality of first vacuum chucks and the plurality of second vacuum chucks to be movable between the first location and the second location.

12. A wafer inspection apparatus, comprising:
a support structure including a frame, the frame including a plurality of vacuum chucks, each vacuum chuck of the plurality of vacuum chucks being mounted on the frame and each vacuum chuck having a support surface including a vacuum suction portion, the support structure configured to structurally support a wafer on one or more vacuum chucks of the plurality of vacuum chucks, the frame defining an opening larger than an area of the wafer, each vacuum chuck configured to be positioned such that the support surface of the vacuum chuck is coplanar with a reference plane on which the wafer is supported by the support structure;
an electromagnetic wave emitter configured to irradiate an inspection electromagnetic wave to the wafer;
a sensor configured to receive the inspection electromagnetic wave from the wafer based on the inspection electromagnetic wave passing through the wafer; and
a driver configured to move at least one of the electromagnetic wave emitter or the frame to change an irradiation location of the wafer,
wherein each vacuum chuck of the plurality of vacuum chucks is configured to be separated from the reference plane to descend along the frame or to be flipped downwardly in relation to the frame.

13. The wafer inspection apparatus of claim 12, wherein
the opening defined by the frame includes a plurality of corner regions that are exposed by the wafer, and
the plurality of vacuum chucks are each configured to be separated from the reference plane based on being moved to the plurality of corner regions at least partially in a horizontal direction of the frame.

14. The wafer inspection apparatus of claim 12, wherein the vacuum suction portion of each vacuum chuck has a concave structure on the support surface of the vacuum chuck.

15. The wafer inspection apparatus of claim 14, further comprising:
a first channel, extending into the frame and being in fluid communication with a vacuum source, and
a second channel extending into a vacuum chuck of the plurality of vacuum chucks, the second channel connected to the vacuum suction portion, the second channel in fluid communication with the first channel.

* * * * *